United States Patent [19]
Lee et al.

[11] Patent Number: 5,818,306
[45] Date of Patent: Oct. 6, 1998

[54] VOLTAGE CONTROL OSCILLATION CIRCUIT USING CMOS

[75] Inventors: Jong-Ryul Lee, Daejeon; Ook Kim, Seoul; Jong-Kee Kwon, Daejeon; Chang-Jun Oh, Daejeon; Won-Chul Song, Daejeon; Kyung-Soo Kim, Daejeon, all of Rep. of Korea

[73] Assignee: Electronics and Telecommunications Research Institute, Daejeon, Rep. of Korea

[21] Appl. No.: 892,938

[22] Filed: Jul. 15, 1997

[30] Foreign Application Priority Data

Dec. 5, 1996 [KR] Rep. of Korea ............... 1996 62144

[51] Int. Cl.[6] .................................................. H03B 5/12
[52] U.S. Cl. .................... 331/117 FE; 331/175; 331/183
[58] Field of Search .................... 331/116 R, 116 FE, 331/116 M, 117 R, 117 FE, 117 D, 175, 182, 183

[56] References Cited

U.S. PATENT DOCUMENTS 5,714,911  2/1998  Gilbert ........................................ 331/57

OTHER PUBLICATIONS

Jan Craninckx et al., "A CMOS 1.8GHz Low–Phase–Noise Voltage–Controlled Oscillator with Prescaler", ISSCC95/ Session 15/ Frequency Synthesizers/Paper FA 15.5, 1995 IEEE, pp. 266–267. 1995 IEEE International Solid State Circuits Conference.

*Primary Examiner*—David Mis
*Attorney, Agent, or Firm*—Jacobson, Price, Holman & Stern, PLLC

[57] ABSTRACT

A voltage control oscillation circuit for a CMOS which is capable of reducing phase noise and power consumption by adapting a voltage amplitude control loop and a common mode feedback circuit to a conventional LC-tank circuit. The circuit includes an LC-tank oscillation unit for outputting an oscillation voltage, an output common mode feedback unit for receiving an output from the LC-tank oscillation unit and eliminating a common mode noise of the output, and a voltage amplitude control unit for controlling a bias current of the LC-tank oscillation unit in accordance with a voltage difference at both ends of an LC-tank oscillation terminal which voltage is applied thereto through the output common mode feedback unit, for thus controlling the amount of an oscillation voltage.

3 Claims, 3 Drawing Sheets

VOLTAGE CONTROL OSCILLATION CIRCUIT USING CMOS

BACKGROUND OF THE INVENTION

1. Field of the Invention

The present invention relates to a voltage control oscillation circuit using a CMOS, and in particular, to an improved voltage control oscillation circuit using a CMOS which is capable of achieving characteristics such as a low phase noise and low electric power consumption which characteristics are required for a mobile communication system.

2. Description of the Conventional Art

Conventionally, when designing a voltage control oscillation circuit, an LC-tank circuit is used because the LC-tank circuit is well applicable to a system which requires a low phase noise as a part having a high quality factor.

However, when actually implementing the system, a coil and a condenser are connected in series. In addition, the circuit is designed in a single end method, so that it is impossible to eliminate secondary frequency components.

SUMMARY OF THE INVENTION

Accordingly, it is an object of the present invention to provide a voltage control oscillation circuit for a CMOS which overcomes the aforementioned problems encountered in the conventional art.

It is another object of the present invention to provide an improved voltage control oscillation circuit for a CMOS which is capable of achieving characteristics such as a low phase noise and low electric power consumption which characteristics are required for a mobile communication system.

It is another object of the present invention to provide an improved voltage control oscillation circuit for a CMOS which is capable of reducing phase noise and power consumption by adapting a voltage amplitude control loop and a common mode feedback circuit to a conventional LC-tank circuit.

To achieve the above objects, there is provided a voltage control oscillation circuit using a CMOS which includes an LC-tank oscillation unit for outputting an oscillation voltage, an output common mode feedback unit for receiving an output from the LC-tank oscillation unit and eliminating a common mode noise of the output, and a voltage amplitude control unit for controlling a bias current of the LC-tank oscillation unit in accordance with a voltage difference at both ends of an LC-tank oscillation terminal which voltage is applied thereto through the output common mode feedback unit, for thus controlling the amount of an oscillation voltage.

To achieve the above objects, there is also provided a voltage control oscillation circuit using a CMOS wherein the LC-tank oscillation unit includes a sink transistor for increasing an oscillation operation voltage.

To achieve the above objects, there is also provided a voltage control oscillation circuit using a CMOS wherein the voltage amplitude control unit includes a current offset unit for previously setting a control voltage.

Additional advantages, objects and other features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

In an integrated circuit, the circuit is differentially designed in order to improve a noise problem. In addition, the operational range of the signal is widened by using a CMOS device having a small conductance, for thus enabling an easier design for the next stage circuit.

The present invention is basically directed to using a voltage control oscillation technique which is a major element in a frequency synthesizer technique. In addition, this technique is one technique by which it is possible to determine the performance of a receiving part and a transmission part based on the characteristic of the technique. Moreover, this technique is a very important technique which determines the characteristic of a frequency synthesizer which generates a signal of a local oscillator needed for a frequency change in a wireless communication system.

Namely, the above-described technique is directed to enhancing the performance of an LC-tank voltage control oscillation circuit, so that it is possible to minimize a temperature-based noise and phase noise by performing the operation of the voltage control oscillation circuit in a linear region through a voltage amplitude controller, and eliminate a common mode noise of the output of a voltage control oscillation circuit by using a common mode feedback unit, for thus increasing the operational voltage up to 2Vt and simplifying the circuit design.

The voltage control oscillation circuit using a CMOS according to the present invention will now be explained in more detail with reference to the accompanying drawings.

Figure 1A:
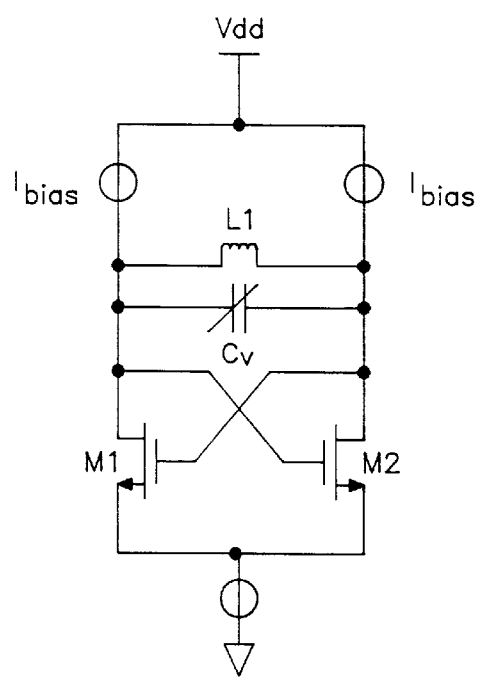
FIG. 1A is a circuit diagram illustrating an LC-tank voltage control oscillation circuit according to the present invention.

FIG. 1A is a basic form of a voltage control oscillation circuit. The oscillation frequency of the oscillation unit is actually determined by the following Equation 1.

$$f_0 = \frac{1}{2\pi\sqrt{LC}} \quad \text{[Equation 1]}$$

where the capacitance C denotes the sum of an original part value and a capacitance of a diode. The depletion region of the diode is changed in accordance with the bias level which is applied thereto, and the oscillation frequency of the voltage control oscillation circuit is changed in accordance with the above-described level.

Figure 1B:
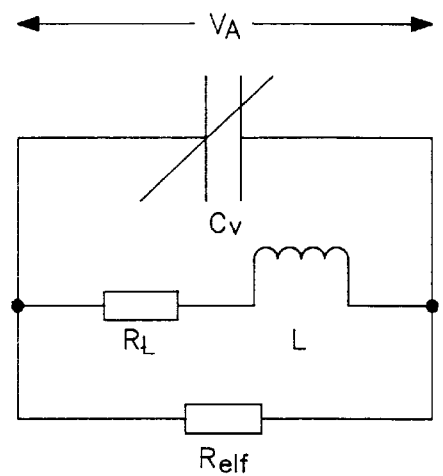
FIG. 1B is a circuit diagram illustrating an equivalent circuit of an LC-tank voltage control oscillation circuit according to the present invention.

FIG. 1B is an equivalent circuit of the voltage control oscillation circuit. The interconnected NMOS transistors are operated by a negative resistance, respectively. The above-described negative resistance is obtained based on the relationship between the terminal current and voltage. On the assumption that the transconductance of M1 and M2 is gm, $R_{eff}$ is obtained by the following Equation 2.

$$R_{eff} = -\frac{1}{g_m} \quad \text{[Equation 2]}$$

The terminal voltage $V_A$ is obtained by a differential equation of KCL.

$$\frac{I}{R_{eff}} + \lambda C + \frac{I}{\lambda L + R_L} = 0 \quad \text{[Equation 3]}$$

$$LC\lambda^2 + \left(R_L + \frac{L}{R_{eff}}\right)\lambda + \frac{R_L}{R_{eff}} + 1 = 0$$

where, $$\lambda = \alpha \mp j\omega_0, \alpha = -\frac{R_l}{2L} - \frac{1}{2R_{eff}C}, \omega_0 \approx \frac{1}{\sqrt{LC}}$$

The following Equation 4 is obtained based on the differential equation of Equation 3.

[Equation 4]

$$V_A = Ae^{\alpha+j\omega_0} + Be^{\alpha-j\omega_0}$$

In addition, based on Equation 4, the following Equation 5 is obtained.

[Equation 5]

$$R_{eff} = -\frac{L}{CR_L}$$

Therefore, $\alpha=0$, The following Equation 6 is obtained.

[Equation 6]

$$V_A = Ae^{j\omega_0} + Be^{j\omega_0}$$

As shown in Equation 6, the voltage control oscillation circuit constantly maintains an amplitude, and continues the oscillation.

Figure 2:
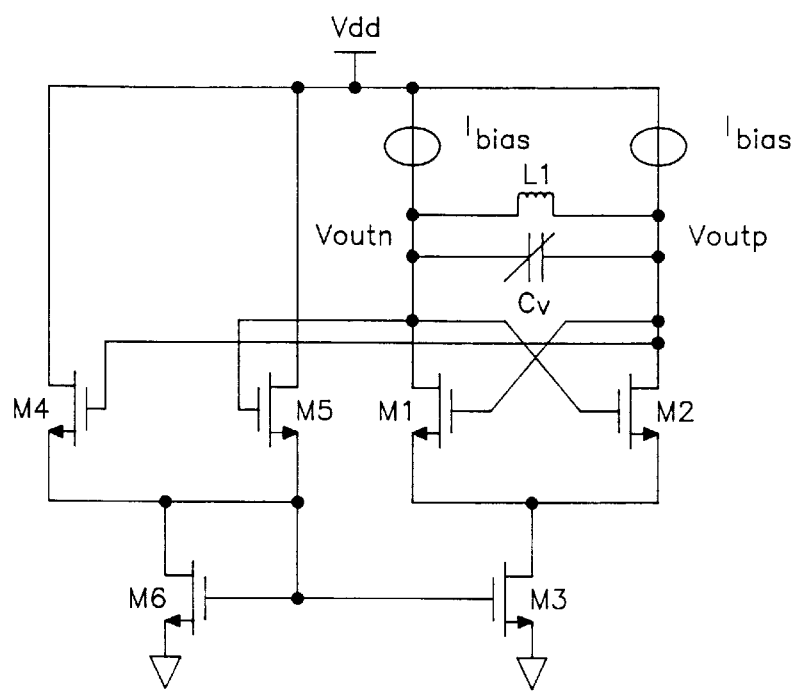
FIG. 2 is a circuit diagram illustrating an output common mode feedback circuit according to the present invention.

FIG. 2 illustrates an output common mode feedback circuit of a voltage control oscillation circuit.

Additionally to the circuit of FIG. 1A, there are further provided transistors M4, M5, M6, and M3.

The above-described circuit is directed to eliminating the noise of a common mode voltage of $V_{outp}$ and $V_{outn}$. The voltage is supplied to the transistor M3, and the voltage is increased up to $2V_t+\Delta$, so that the voltage is connected to the input of the amplitude controller (as shown in FIG. 3) of the next stage, so that the circuit is stably operated in the active region.

In order to maintain the state of Equation 5, there are a few methods. Among them, there is one method that a nonlinear device is disposed between tank circuits, so that as the amplitude of the output voltage is increased, an admittance is increased, and the output switching voltage is clipped.

In the transistors M1 and M2 as shown in FIG. 1A, as the amplitude of the output therefrom is increased, the output is inputted into the linear region, and the admittance is increased. This structure increases the power consumption because a larger conductance is needed due to the variable of the periphery device and the oscillation of the tank circuit, so that the heat-based noise of the voltage control oscillation circuit and the phase noise are increased.

Figure 3:
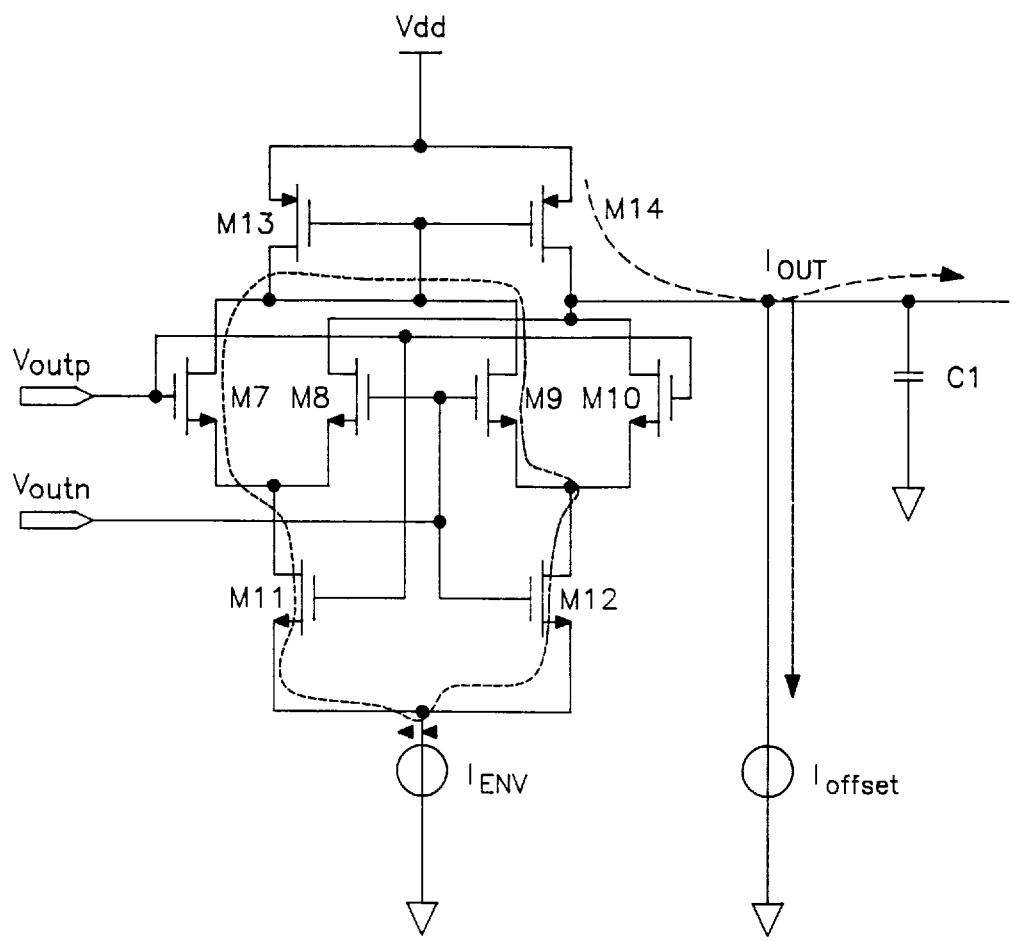
FIG. 3 is a circuit diagram illustrating a voltage amplitude control unit according to the present invention.

In order to overcome the problems of the above-described circuit, the voltage amplitude controller is configured as shown in FIG. 3.

When the voltage $V_{outn}$ is larger than $V_{outp}$, the current $I_{ENV}$ flows to the transistors M7 and M11, so that the current $I_{out}$ is increased. In addition, when the voltage $V_{outn}$ is smaller than $V_{outp}$, the current $I_{ENV}$ flows to the transistors M9 and M12, for thus increasing the current $I_{out}$. The larger the input amplitude, the larger the current $I_{out}$. Finally, the current is stored in the capacitor C1, and the voltage at the capacitor C1 is increased, and the bias of the tank circuit is reduced, and the conductance gm is decreased, so that the amplitude of the oscillation voltage is decreased. In addition, the oscillation amplitude is previously set. When a predetermined amount of the current is eliminated, the LC-tank circuit is controlled by the voltage generated by the remaining current, and the offset current is set so that the voltage control oscillation unit is properly operated.

Figure 4:
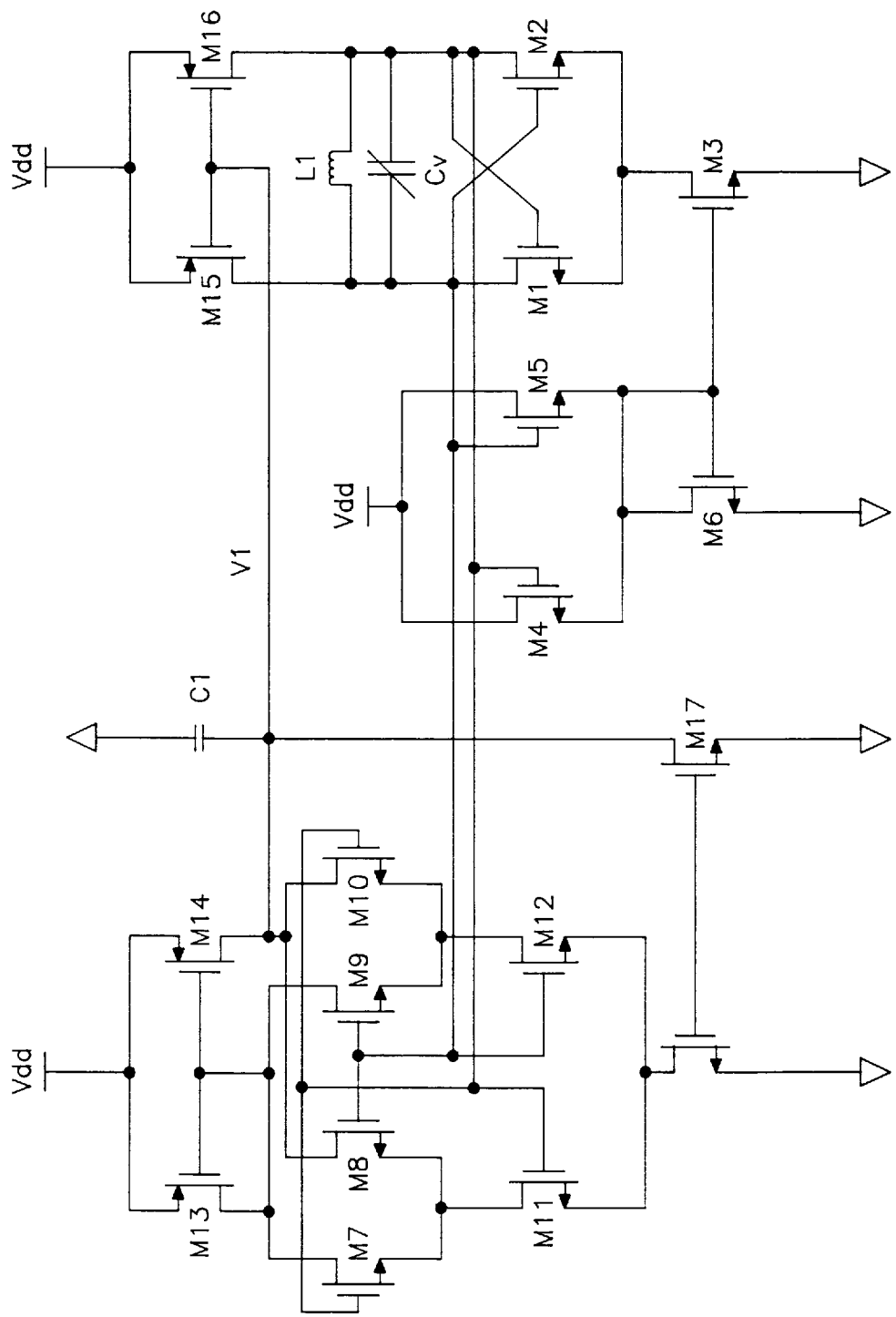
FIG. 4 is a circuit diagram illustrating a CMOS voltage control oscillation circuit according to the present invention.

FIG. 4 illustrates a CMOS voltage control oscillation circuit according to the present invention.

The operation thereof will now be explained.

The oscillation voltage at both sides of the LC-tank circuit is inputted to the voltage control amplifier, and is detected in accordance with the amplitude value, and is changed to the current value. Thereafter, the voltage is stored in the capacitor C1 connected to the voltage V1. The current value offset is subtracted from the above-described voltage current, and the resultant value is changed into the control voltage form the LC-tank circuit. This voltage is used for controlling the conductances gm of the transistors M15 and M16. Therefore, the amplitude of the oscillation voltage is determined in order to satisfy the value of gm and Equation 5, so that the oscillator is stable operated based on the amplitude. As shown in FIG. 4, the circuit is designed as a first control loop, so that it is possible to implement a stable operation of the circuit.

The voltage control oscillation circuit using a CMOS according to the present invention is directed to stably operating the circuit by configuring the circuit by using a CMOS device, so that it is possible to implement a low phase noise of the voltage control oscillation circuit, which circuit is well applicable to a frequency combiner for a mobile communication system.

Although the preferred embodiments of the present invention have been disclosed for illustrative purposes, those skilled in the art will appreciate that various modifications, additions and substitutions are possible, without departing from the scope and spirit of the invention as recited in the accompanying claims.

What is claimed is:

1. A voltage control oscillation circuit using a CMOS, comprising:
   an LC-tank oscillation unit for outputting an oscillation voltage;
   an output common mode feedback unit for receiving an output from the LC-tank oscillation unit and eliminating a common mode noise of the output; and
   a voltage amplitude control unit for controlling a bias current of the LC-tank oscillation unit in accordance with a voltage difference at both ends of an LC-tank oscillation terminal which voltage is applied thereto through the output common mode feedback unit, for thus controlling the amount of an oscillation voltage.

2. The circuit of claim 1, wherein said LC-tank oscillation unit includes a sink transistor for increasing an oscillation operation voltage.

3. The circuit of claim 1, wherein said voltage amplitude control unit includes a current offset means for previously setting a control voltage.

* * * * *